(12) United States Patent
Zamprogno et al.

(10) Patent No.: US 11,057,022 B2
(45) Date of Patent: Jul. 6, 2021

(54) PVT COMPENSATED DELAY CELL FOR A MONOSTABLE

(71) Applicants: STMicroelectronics S.r.l., Agrate Brianza (IT); Politecnico Di Milano, Milan (IT)

(72) Inventors: Marco Zamprogno, Cesano Maderno (IT); Alireza Tajfar, Leuven (BE)

(73) Assignees: STMicroelectronics S.r.l., Agrate Brianza (IT); Politecnico Di Milano, Milan (IT)

( * ) Notice: Subject to any disclaimer, the term of this patent is extended or adjusted under 35 U.S.C. 154(b) by 0 days.

(21) Appl. No.: 16/454,872

(22) Filed: Jun. 27, 2019

(65) Prior Publication Data

US 2020/0412344 A1    Dec. 31, 2020

(51) Int. Cl.
*H03K 3/011* (2006.01)
*H03K 3/033* (2006.01)
(Continued)

(52) U.S. Cl.
CPC ............ *H03K 3/011* (2013.01); *H01S 5/0428* (2013.01); *H03K 3/033* (2013.01); *H03K 5/13* (2013.01);
(Continued)

(58) Field of Classification Search
CPC ........ H03K 3/011; H03K 3/0133; H03K 5/13; H03K 5/131; H03K 5/133; H03K 5/134; H03K 5/135; H03K 5/14; H03K 2005/00013; H03K 2005/0015; H03K 2005/00195; H03K 2005/00202; H03K 2005/00208; H03K 2005/00215; H03K 2005/00221; G05F 3/00; G05F 3/02; G05F 3/08; G05F 3/10; G05F 3/16; G05F 3/20; G05F 3/24; G05F 3/242; G05F 3/345; G05F 3/347
See application file for complete search history.

(56) References Cited

U.S. PATENT DOCUMENTS 4,843,265 A    6/1989 Jiang
5,130,582 A    7/1992 Ishihara et al.
(Continued)

OTHER PUBLICATIONS

EP Search Report and Written Opinion for co-pending EP Appl. No. 20179714.9 dated Nov. 26, 2020 (9 pages).
(Continued)

*Primary Examiner* — Diana J. Cheng
(74) *Attorney, Agent, or Firm* — Crowe & Dunlevy

(57) ABSTRACT

A monostable circuit includes a delay cell with a reference generator generating a reference current based upon a PVT invariant resistance and a threshold voltage, and a delay block with an output capacitor and an output circuit altering an amount of charge stored on the output capacitor as a function of the reference current, in response to an input signal. An inverter has an input coupled to the output circuit. A logic circuit logically combines output of the inverter and the input signal to generate a monostable trigger pulse. The output circuit includes a current source sourcing the reference current to the output capacitor in response to a first logic state of an input signal, and a current sink sinking current from the output capacitor to discharge the output capacitor, in response to a second logic state of the input signal.

20 Claims, 4 Drawing Sheets

(51) Int. Cl.
  *H03K 5/13* (2014.01)
  *G05F 3/24* (2006.01)
  *H03K 5/00* (2006.01)
  *H01S 5/042* (2006.01)
  *G01S 7/484* (2006.01)
  *G01S 17/10* (2020.01)

(52) U.S. Cl.
  CPC ............... *G01S 7/484* (2013.01); *G01S 17/10* (2013.01); *G05F 3/242* (2013.01); *H03K 2005/00195* (2013.01)

(56) References Cited

U.S. PATENT DOCUMENTS

| | | | |
|---|---|---|---|
| 5,848,044 | A | 12/1998 | Taguchi et al. |
| 6,259,714 | B1 | 7/2001 | Kinbara |
| 6,417,738 | B1 | 7/2002 | Lautzenhiser |
| 6,771,133 | B2 | 8/2004 | Lautzenhiser |
| 6,819,612 | B1 * | 11/2004 | Achter .................. G11C 7/065 365/189.11 |
| 7,298,173 | B1 * | 11/2007 | Jiang ..................... H03K 5/01 326/82 |
| 10,291,192 | B1 * | 5/2019 | Casey .................... H03F 3/505 |
| 2003/0001637 | A1 | 1/2003 | Jung |
| 2003/0012321 | A1 | 1/2003 | Tokutome et al. |
| 2003/0200518 | A1 | 10/2003 | Saeki |
| 2003/0201812 | A1 | 10/2003 | Suzuki |
| 2005/0243879 | A1 | 11/2005 | Horiuchi et al. |
| 2007/0188206 | A1 | 8/2007 | Lee |
| 2011/0064098 | A1 | 3/2011 | Omori et al. |
| 2012/0008342 | A1 | 1/2012 | Hsu et al. |
| 2012/0154001 | A1 | 6/2012 | Seo |
| 2014/0203854 | A1 | 7/2014 | Jung et al. |
| 2015/0097604 | A1 | 4/2015 | Taniguchi |
| 2016/0054447 | A1 | 2/2016 | Sun et al. |
| 2016/0173109 | A1 | 6/2016 | Montoriol et al. |
| 2018/0278017 | A1 | 9/2018 | Mignoli et al. |
| 2018/0323576 | A1 | 11/2018 | Crawford et al. |

OTHER PUBLICATIONS

Chen, Jie-Ting, et al: "On-Chip ESD Protection Device for High-Speed I/O Applications in CMOS Technology," IEEE Transactions on Electron Devices, vol. 64, No. 10, Oct. 2017.

\* cited by examiner

PVT COMPENSATED DELAY CELL FOR A MONOSTABLE

TECHNICAL FIELD

This application is directed to the field of laser driving and, in particular, is directed to a circuit for generating a trigger pulse for a laser drive circuit.

BACKGROUND

Time-of-flight ranging applications, such as Light Detection and Ranging (LIDAR), utilize a laser diode (typically infrared) that is driven with a pulsed drive current to cause it to emit a short laser pulse in a given direction. The laser pulse is reflected by a (possible) object in that given direction, and a receiver receives and reads the reflected laser pulse. The receiver, with a proper timing reference, measures the elapsed time between emitting the laser pulse and receiving the reflected laser pulse. From this elapsed time, the distance to the object can be evaluated.

In addition to typical challenges involved with this technology that are known and understood by those of skill in the art (e.g., dark pulses, averaging of received reflected pulses, and the use of post-processing to obtain a desired level of accuracy), it is desired to reduce the pulse width of the laser pulse. For example, taking into account the elapsed time for the laser pulse to reach the object, be reflected off the object, and return to the receiver, since the speed of light is known and constant, the distance to the object can be determined; therefore, as a numerical example, each time t of 1 ns can be associated with a distance of d=2*c*t=60 cm, where c is the speed of light. An optical pulse on the order of 1 ns is therefore not useful if it is desired to discriminate distances below 60 cm with accuracy.

Since the pulse width of the optical pulse is related to the pulse width of the pulsed drive current, it is therefore desired to be able to produce a pulsed drive current having a shorter pulse width so that the pulse width of the laser pulses can be reduced to thereby increase accuracy and enable discrimination of even shorter distances. In addition, it is desired for the pulses of the drive current to have a pulse width that is as stable as possible despite process, voltage, and temperature variation. Since this pulse width cannot be neglected with reference to the time to be measured, this described stability is of particular concern.

In general, ranging systems provide a sequence of multiple laser light pulses, receive the reflected pulses that have reflected off an object and returned to the receiver, and perform an averaging process to extract the time of flight information by canceling noise, disturbances, etc. If the pulse width of the pulses of the drive current are not stable, errors would be induced with this process, and therefore the accuracy of the distance measurements would be reduced. While temperature and supply variation is present with time of flight systems, it is desired to reduce their effect on the pulse width of the pulses of the drive current so that it is below a critical threshold.

Known prior art ranging systems utilize edge triggered damped laser drivers producing pulsed drive currents for generating the laser pulses used in ranging operations. By "edge triggered", it is meant that these laser drivers begin generating a pulsed drive current in response to receipt of an edge of a trigger signal, and that the subsequent edge of the trigger signal is not involved in the generation of the pulse drive current.

The pulsed drive current generated by these prior art ranging systems utilizing edge triggered damped laser drivers is shown in FIG. 1A. A sharp narrow drive pulse is desired when making a ranging measurement for spatial accuracy. However, it should be appreciated that prior art laser drivers involve certain tradeoffs. The narrower the drive pulse, the sharper its rise and fall. Too sharp of a fall can cause "ringing", by which the drive current of the drive pulse oscillates (shown by the dashed line labeled as "Oscillation"), potentially with enough magnitude to cause emission of a second (unplanned) laser pulse, which is undesirable for any ranging application. While a drive pulse can be shaped so as to have a sharp rise and slow fall (shown by the dashed line labeled as "Slow"), a slow fall can impact efficiency, and is therefore undesirable. Therefore, existing prior art ranging systems dampen (but do not widen) the fall of the drive pulse, producing the pulse shown with a solid line.

While these prior art designs enable the generation of a pulsed drive current without ringing, they fail to reduce the pulse width of the produced laser drive current sufficiently for some purposes, fail to produce a laser drive current pulse that is as high as desired for some purposes, and have a recovery time longer than desired for some purposes.

As disclosed in U.S. application Ser. No. 16/454,717, entitled "LASER DRIVE INCORPORATING CLAMPING CIRCUIT WITH FREEWHEELING DIODE", filed concurrently with this application, the contents of which are incorporated by reference in their entirety (and which are inventive, and not to be considered prior art), it is possible to design an underdamped pulse triggered (as opposed to edge triggered) laser driver topology that generates a very narrow laser drive current pulse. Due to the underdamped nature of such a laser driver, the narrowness of the pulse width of the produced laser drive current pulse is directly related to the narrowness of the pulse width of the trigger pulse. In addition, for consistency between produced drive pulses, it is desired for the trigger pulses to have precisely the same duration and therefore for the duration of the trigger pulses to be precisely controlled. While prior art delay cells exist that can produce trigger pulses, their performance is insufficient for the application disclosed in U.S. application Ser. No. 16/454,717, and therefore further development is needed.

SUMMARY

Disclosed herein is a monostable circuit including a delay cell. The delay cell includes a reference inverter having its input coupled to its output and configured to generate a threshold voltage, a reference current generator configured to generate a reference current as a function of the threshold voltage and a process, voltage, and temperature (PVT) invariant resistance, and a delay block. The delay block includes an output capacitor, and an output circuit configured to alter an amount of charge stored on the output capacitor as a function of the reference current, in response to an input signal. An output inverter has an input coupled to the output circuit of the delay block and having an output, and a logic circuit is configured to logically combine the output of the output inverter and the input signal to generate a monostable trigger pulse.

The output circuit of the delay block may include a current source configured to source the reference current to the output capacitor in response to a first logic state of an input signal, and a current sink configured to sink current from the output capacitor to discharge the output capacitor, in response to a second logic state of the input signal.

The output circuit of the delay block may include: a first p-channel transistor having a source coupled to receive the reference current, a drain, and a gate coupled to receive the input signal; a second p-channel transistor having a source coupled to the source of the first p-channel transistor, a drain coupled to ground, and a gate coupled to receive a complement of the input signal; and an n-channel transistor having a drain coupled to the drain of the first p-channel transistor, a source coupled to ground, and a gate coupled to receive the input signal. The output capacitor may be coupled between the drain of the n-channel transistor and ground.

The output circuit of the delay block may also include an output inverter having an input coupled to the drain of the n-channel transistor and an output coupled to the output inverter.

The reference current generator may include a reference voltage generator configured to generate a reference voltage, and a first transconductance amplifier having a first input coupled to receive the reference voltage, a second input coupled to receive a feedback voltage, and an output. The reference current generator may also include a PVT invariant resistance, and an n-channel transistor having a drain, a source coupled to the PVT invariant resistance, and a gate coupled to the output of the first transconductance amplifier, with the PVT invariant resistance being coupled between the source of the n-channel transistor and ground. A p-channel transistor may have a source coupled to a supply voltage, a drain coupled to the drain of the n-channel transistor of the reference current generator, and a gate coupled to the drain of the p-channel transistor of the reference current generator. The delay block may include a third p-channel transistor having a source coupled to the supply voltage, a drain coupled to the source of the first p-channel transistor of the output circuit of the delay block, and a gate coupled to the gate of the p-channel transistor of the reference current generator.

The PVT invariant resistance may include a reference resistance generator configured to generate a reference resistance based upon a bandgap current and a bandgap voltage, and a replica resistance generator coupled to the reference resistance generator and configured to generate a resistance value for the PVT invariant resistance that is equal to a resistance value of the reference resistance.

The PVT invariant resistance may include a bandgap current generator coupled to provide a bandgap current to a node, and a transconductance amplifier having a first input coupled to the node, a second input coupled to receive a bandgap voltage, and an output. The PVT invariant resistance may also include a reference resistance generator including: a first reference n-channel transistor having a drain coupled to the node through a first reference resistor, a source coupled to ground, and a gate coupled to the output of the transconductance amplifier of the PVT invariant resistance, and a second reference n-channel transistor having a drain coupled to the node through a second reference resistor, a source coupled to ground, and a gate selectively coupled to the output of the transconductance amplifier of the PVT invariant resistance through a first switch controlled by a selection signal.

The transconductance amplifier of the PVT invariant resistance may drive the gates of the first and second reference n-channel transistors such that a voltage produced at the node equals the bandgap voltage.

A replica resistance generator may include: a first replica n-channel transistor having a drain coupled to the source of the n-channel transistor of the reference current generator through a first replica resistor, a source coupled to ground, and a gate coupled to the output of the transconductance amplifier of the PVT invariant resistance; and a second reference n-channel transistor having a drain coupled to the source of the n-channel transistor of the reference current generator through a second replica transistor, a source coupled to ground, and a gate selectively coupled to the output of the transconductance amplifier of the PVT invariant resistance through a second switch controlled by a selection signal.

A feedback circuit may be configured to compare the output of the transconductance amplifier of the PVT invariant resistance to a calibration voltage, to reduce an output voltage of the transconductance amplifier if the output voltage of transconductance amplifier is sufficiently higher than the reference voltage by turning on the second reference n-channel transistor by adjusting the selection signal such that the first switch and second switch close, and to increase the output voltage if the output of the transconductance amplifier is sufficiently lower than the reference voltage by turning off the second reference n-channel transistor by adjusting the selection signal such that the first switch and second switch open.

The threshold voltage generated by the reference inverter may be substantially equal to a threshold voltage of the output inverter.

The output circuit of the delay block may include: a first n-channel transistor having a source coupled to receive the reference current, a drain, and a gate coupled to receive the input signal; a second n-channel transistor having a source coupled to the source of the first n-channel transistor, a drain coupled to a supply voltage, and a gate coupled to receive a complement of the input signal; and a p-channel transistor having a drain coupled to the drain of the first n-channel transistor, a source coupled to the supply voltage, and a gate coupled to receive the input signal. The output capacitor may be coupled between the drain of the p-channel transistor and the supply voltage.

The output circuit of the delay block may also include an output inverter having an input coupled to the drain of the n-channel transistor.

The reference current generator may include a reference voltage generator configured to generate a reference voltage and a first transconductance amplifier having a first input coupled to receive the reference voltage, a second input coupled to receive a feedback voltage, and an output. The reference current generator may also include a PVT invariant resistance. The reference current generator may also include: an n-channel transistor having a drain, a source coupled to the PVT invariant resistance, and a gate coupled to the output of the first transconductance amplifier, with the PVT invariant resistance being coupled between the source of the n-channel transistor of the reference current generator and ground; a first p-channel transistor having a source coupled to the supply voltage, a drain coupled to the drain of the n-channel transistor of the reference current generator, and a gate coupled to the drain of the first p-channel transistor of the reference current generator; and a second p-channel transistor having a source coupled to the supply voltage, a drain, and a gate coupled to the gate of the first p-channel transistor of the reference current generator.

The delay block may include: a third n-channel transistor having a source coupled to ground, a drain coupled to the drain of the second p-channel transistor of the reference current generator, and a gate coupled to the drain of the third n-channel transistor; and a fourth n-channel transistor having a source coupled to ground, a drain coupled to the source of the first n-channel transistor of the output circuit of the delay block, and a gate coupled to the gate of the third n-channel transistor.

The PVT invariant resistance may include a reference resistance generator configured to generate a reference resistance based upon a bandgap current and a bandgap voltage, and a replica resistance generator coupled to the reference resistance generator and configured to generate a resistance value for the PVT invariant resistance that is equal to a resistance value of the reference resistance.

The PVT invariant resistance may include a bandgap current generator coupled to provide a bandgap current to a node, and a transconductance amplifier having a first input coupled to the node, a second input coupled to receive a bandgap voltage, and an output. The PVT invariant resistance may include a reference resistance generator having: a first reference n-channel transistor having a drain coupled to the node through a first reference resistor, a source coupled to ground, and a gate coupled to the output of the transconductance amplifier of the PVT invariant resistance; and a second reference n-channel transistor having a drain coupled to the node through a second reference resistor, a source coupled to ground, and a gate selectively coupled to the output of the transconductance amplifier of the PVT invariant resistance through a first switch controlled by a selection signal. The transconductance amplifier of the PVT invariant resistance may drive the gates of the first and second reference n-channel transistors such that a voltage produced at the node equals the bandgap voltage.

A replica resistance generator may include: a first replica n-channel transistor having a drain coupled to the source of the n-channel transistor of the reference current generator through a first replica resistor, a source coupled to ground, and a gate coupled to the output of the transconductance amplifier of the PVT invariant resistance; and a second reference n-channel transistor having a drain coupled to the source of the n-channel transistor of the reference current generator through a second replica transistor, a source coupled to ground, and a gate selectively coupled to the output of the transconductance amplifier of the PVT invariant resistance through a second switch controlled by a selection signal.

A feedback circuit may be configured to compare the output of the transconductance amplifier of the PVT invariant resistance to a calibration voltage, to reduce an output voltage of the transconductance amplifier if the output voltage of transconductance amplifier is sufficiently higher than the reference voltage by turning on the second reference n-channel transistor by adjusting the selection signal such that the first switch and second switch close, and to increase the output voltage if the output of the transconductance amplifier is sufficiently lower than the reference voltage by turning off the second reference n-channel transistor by adjusting the selection signal such that the first switch and second switch open.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. It should be understood that the term "coupled" can mean "directly electrically connected without intervening components", or can mean "indirectly electrically connected due to intervening components". Therefore, the term "coupled" as used herein is not limited.

Figure 1A:
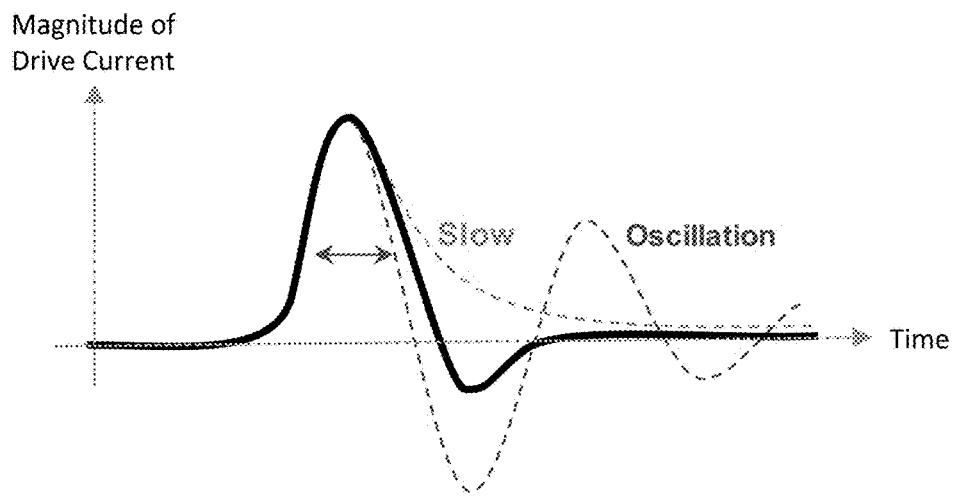
FIG. 1A is a graph of a sample pulsed drive current for a laser diode, according to the prior art.
Figure 1B:
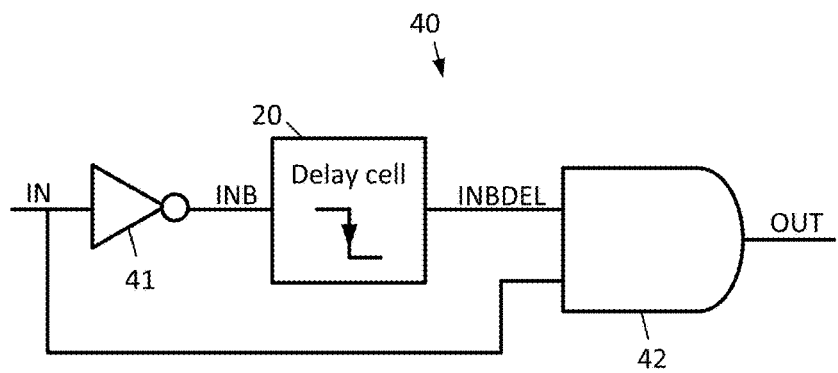
FIG. 1B is a block diagram of a prior art monostable circuit described herein.

Now disclosed with reference to FIG. 1B is a prior art monostable circuit 40 including an inverter 41 receiving a trigger input signal IN and outputting its complement INB. A falling edge triggered delay cell 20 receives INB and outputs a delayed version thereof, labeled as INBDEN. An AND gate 42 receives INBDEL and IN, performs a logical AND operation thereon, and produces a monostable output trigger pulse OUT based upon the logical AND operation.

Figure 1C:
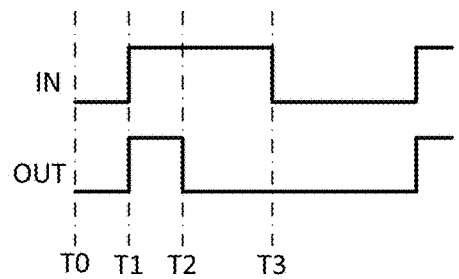
FIG. 1C is a timing diagram showing operation of the prior art monostable circuit of FIG. 1B.

Operation is now described with additional reference to FIG. 1C. In operation, when the trigger input signal IN is low, the AND gate 42 has one input low, and therefore the monostable output trigger pulse OUT is low (which can be seen at time T0). When the trigger input signal IN goes high, due to the delay provided by the delay cell 20, the output of the delay cell 20 will still be high, and therefore the monostable output trigger pulse OUT is high (which can be seen at time T1). Once the delay time provided by the delay cell 20 has elapsed (which occurs at time T2), INBDEL will fall low, and therefore the monostable output trigger pulse OUT will be low due to the AND gate 42 receiving a low signal as input. Therefore, the monostable output trigger pulse has been generated and has a pulse width defined by the delay cell 20, which begins upon the falling edge of INB. Note that since the monostable output trigger pulse OUT will already be low when the trigger input signal IN goes low (which occurs at time T3), the state of the monostable output trigger pulse OUT does not change when the trigger input signal IN goes low. The short delay between the trigger input signal IN going low and INBDEL going high provided by the inverter 41 helps to avoid glitching with the monostable output trigger pulse OUT.

Figure 2:
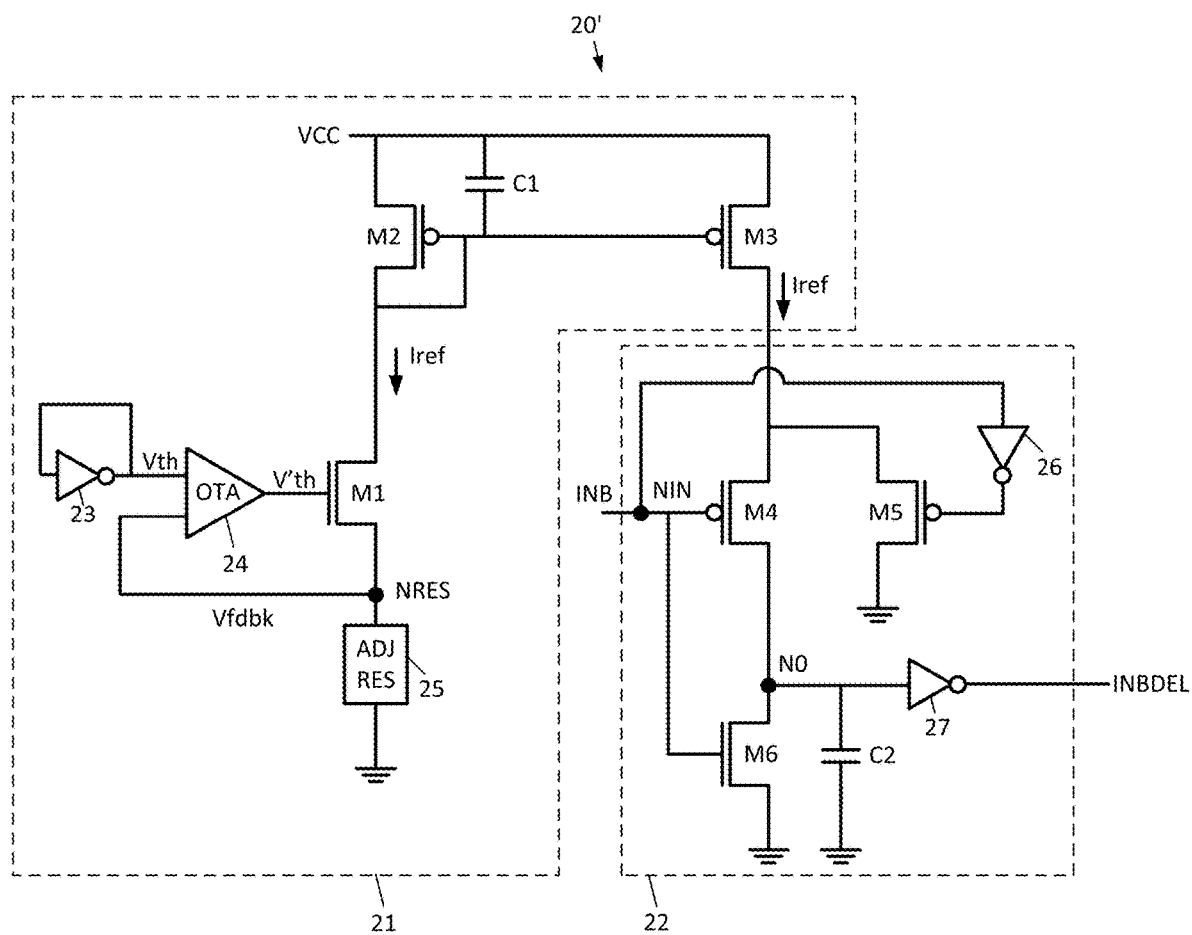
FIG. 2 is a schematic diagram of a delay cell disclosed herein that is usable with the monostable circuit of FIG. 2.

Referring now to FIG. 2, a delay cell 20' disclosed herein includes a bias current generator 21 that generates a reference current Iref for a delay block 22, which in turn generates a delay output DOUT for use in generating the monostable output trigger pulse OUT.

The bias current generator 21 is comprised of an inverter 23 coupled in a feedback arrangement with itself, having its input coupled to its output. A transconductance amplifier 24 has a first input coupled to the output of the inverter 23, a second input coupled to node NRES, and an output. An n-channel transistor M1 has its source coupled to node NRES and its gate coupled to the output of the transconductance amplifier 24. An adjustable resistance 25 is coupled between node NRES and ground. A p-channel transistor M2 has its source coupled to a supply node to receive a supply voltage VCC, its drain coupled to the drain of n-channel transistor M1, and its gate coupled to its drain and coupled to its source through a filtering capacitor C1. A p-channel transistor M3 has its source coupled to the supply node to receive the supply voltage VCC and its gate coupled to the gate of the p-channel transistor M2.

The delay block 22 is comprised of a p-channel transistor M4 having its source coupled to the drain of the p-channel transistor M3 and its gate coupled to an input node NIN to receive an input signal INB. A p-channel transistor M5 has its source coupled to the source of the p-channel transistor M4 and its drain coupled to ground. An inverter 26 has an input coupled to node NIN and an output coupled to the gate of the p-channel transistor M5. An n-channel transistor M6 has its drain coupled to the drain of the p-channel transistor M4 at node N0, its source coupled to ground, and its gate coupled to the input node NIN to also receive the input signal INB. A capacitor C2 is coupled between the drain of the n-channel transistor M6 and ground. An inverter 27 has an input coupled to the drain of the n-channel transistor M6, and produces the delayed edge INBDEL at its output.

Before operation is described, it is pointed out that the connection of the input of the inverter 23 to the output of the inverter 23 generates a reference voltage Vth that is, at first order if the input rising/falling edge is not too quick, an approximation of the threshold voltage of the inverter 23 itself (e.g., the voltage at which an input rising/falling edge leads to an output falling/rising edge). Indeed, the reference voltage Vth is a partition of the supply voltage VCC, based upon the on resistance of the p-channel and n-channel MOS transistor in the inverter 23 in that topological configuration. These on resistances are temperature, process, and supply voltage dependent.

The transconductance amplifier 24 is in a closed loop with the n-channel transistor M1 and the adjustable resistance 25. The loop forces the feedback voltage Vfdbk to be equal to Vth. As a consequence, the reference current Iref sunk by the n-channel transistor M1 is defined by the ratio Vfdbk/R=Vth/R (with being R the resistance value of the adjustable resistance 25). This reference current Iref is then sunk by the p-channel transistor M2 and mirrored by the p-channel transistor M3 as reference current for the delay cell core 22. Therefore, the reference current Iref depends on Vth and on R Note that the adjustable resistance 25 is process, voltage, and temperature (PVT) invariant, as will be explained below.

Since p-channel transistors M2 and M3 are in a current mirror relationship, the reference current Iref is mirrored (such as with a 1:1 ratio, but can be at other ratios) to the sources of p-channel transistors M4 and M5.

Assume that the capacitor C2 was fully discharged in the previous phase when INB was high and therefore the n-channel transistor M6 was on while the p-channel transistor M4 was off, therefore connecting node N0 to ground at low impedance.

Therefore, when the input signal INB goes low, the p-channel transistor M5 is switched off by the output of the inverter 26, while the p-channel transistor M4 turns on and the n-channel transistor M6 turns off. Assuming that the voltage on node N0 follows a perfect ramp as soon as the reference current Iref starts to flow into the capacitor C2, the time for the inverter 27 to switch is given by $\Delta t = C2*Vth/Iref$. As anticipated, the matching between inverters 23 and 27 provides for both inverters having approximately the same threshold voltage. Note that the 'real' threshold voltage of the inverter 27 will be slightly different than Vth (on top of any difference resulting from geometrical effects) due to a dynamic component associated with the fast (sharp) input signal INB edge.

Then, since Iref=Vth/R, it can be seen that $\Delta t = R*C2$, still assuming that the resistance R of the adjustable resistance 25 is PVT invariant. Capacitors with zero or negligible dependency on temperature and supply may be used. This means that, regarding the assumption of the invariance of the resistance R of the adjustable resistance 25 to PVT, the delay $\Delta t$ will be independent of temperature and supply variation, and therefore the variation of concern with the capacitor C2 is process variation. A simple trimming can be used to adjust the value of the capacitance of C2 in order to define the desired value for the delay $\Delta t$. Once its nominal value is defined, as demonstrated, the delay $\Delta t$ will not be dependent on temperature and supply variation.

Since the delay $\Delta t$ is a function of the reference current Iref, the mirroring ratio of the p-channel transistors M2 and M3 may be set so as to help produce a desired delay; this allows for an embodiment in which the current mirror formed by p-channel transistors M2 and M3 includes additional transistors that may selectively be switched into the current mirror so as to adjust the mirroring ratio and allow programmability of the delay (for example, to adjust the delay in a range of sub-nanoseconds to tens of nanoseconds).

When the input signal INB goes high, the n-channel transistor M6 quickly discharges the capacitor C2, and therefore the voltage at node N0 falls to ground. The inverter 27 accordingly drives its output INBDEL high. On this input edge, the delay between input INB going high and INBDEL going high is short, and therefore PVT variation is not particularly relevant or of concern.

Note that when the input signal INB goes low, the p-channel transistor M4 turns on and the current Iref flows into capacitor C2, while the p-channel transistor M5 and the n-channel transistor M6 are turned off. Also note that when the input signal INB goes high, the n-channel transistor M6 is turned on as stated, and discharges the capacitor C2 while the p-channel transistor M4 is off. At the time, the p-channel transistor M5 is turned on so as to allow the reference current Iref coming from the p-channel transistor M3 to continue to flow to ground, through the p-channel transistor M5. This way, the p-channel transistor M3 is not switched off and continues to operate as a current generator, and therefore as soon as the p-channel transistor M4 is turned on when INB goes low, Iref is ready at its proper value. In greater detail, note that when the p-channel transistor M5 is on, it grounds the drain of the p-channel transistor M3, biasing the p-channel transistor M3 in the same condition from which it will start when the p-channel transistor M4 switches on (when INB goes low), assuming that the capacitor C2 was fully discharged by the n-channel transistor M6 during the previous phase. Therefore, the use of the p-channel transistor M5 allows the biasing of the p-channel transistor M3 to be continuous at the time at which INB is switching from high to low.

Without the use of p-channel transistor M5, when the p-channel transistor M4 is switched off, its source would rise in voltage to VCC and therefore switch p-channel transistor M3 off or nearly off, with the result being that the reference current Iref would drop to zero. Then, later, when the p-channel transistor M4 switches off, there would be a delay before the reference current Iref rises to its nominal value, affecting the ramp voltage produced on node N0, affecting the charging time of the capacitor C2, and therefore negatively impacting the precision and stability of the delay $\Delta t$.

In addition, charge injection related to the switching of the p-channel transistor M4 could introduce additional imprecision into the ramp-like transient behavior. In addition, the driving of the p-channel transistor M5 opposite in phase to the p-channel transistor M4 allows compensation for charge injection related to the switching of the p-channel transistor M4.

While the delay cell 20' has been described as generating the delay in response to the falling edge of the input signal INB, those of skill in the art will quickly understand how to adapt the delay cell 20' to instead generate the delay in response to a rising edge of the input signal INB (e.g., by rearranging the delay cell 20' such that the n-channel transistor M6 relies upon the reference current Iref to discharge the delay cell 20'), or how to adapt the delay cell 20' to instead generate the delay at both edges of the input signal INB (e.g., by rearranging the delay cell such that both the n-channel transistor M6 and p-channel transistor M4 rely upon the reference current Iref).

Figure 4A:
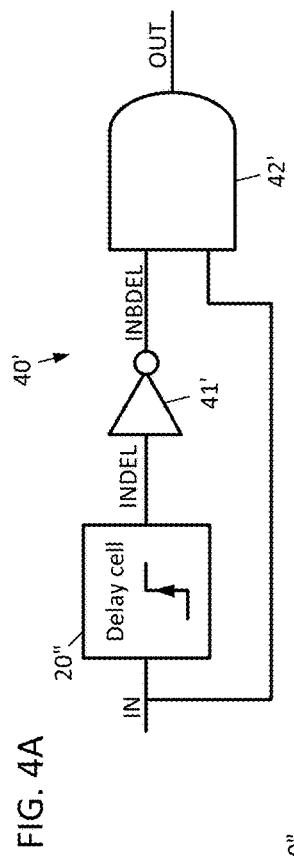
FIG. 4A is a block diagram of a monostable circuit described herein.
Figure 4B:
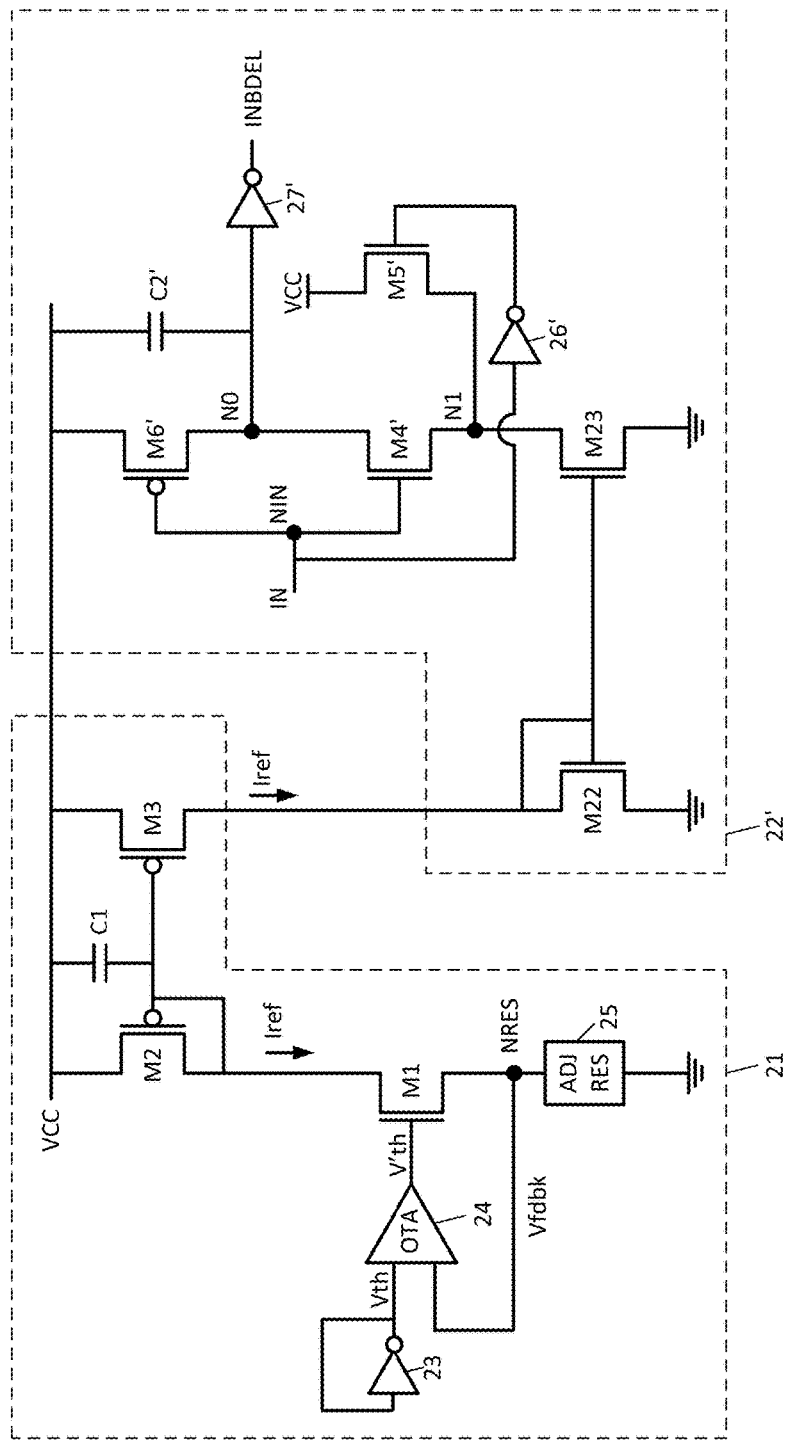
FIG. 4B is a schematic diagram of the delay cell of the monostable circuit of FIG. 4A.

For example, refer now to FIG. 4A (showing a monostable circuit 40') and FIG. 4B (showing a delay cell 20") for the case where the delay is to be generated in response to a rising edge of the input signal IN.

The monostable circuit 40' is comprised of the delay cell 20" receiving the trigger input signal IN and generating a delayed version thereof, labeled as INDEL. An inverter 41' has an input receiving INDEL and an output at which a complement thereof is generated, labeled as INBDEL. An AND gate 42' has a first input receiving INBDEL and a second input receiving IN, performs a logical AND operation on INBDEL and IN, and generates an output OUT being the result of a logical AND operation on INBDEL and IN.

The bias current generator 21 remains unchanged from that of FIG. 2, and therefore needs no further description. Here, however, the delay cell core 22' is different from the delay cell core 22 of FIG. 2. In particular, the reference current Iref is received and mirrored by a current mirror formed from n-channel transistors M22 and M23 to node N1. N-channel transistor M4' has its source coupled to node N1, its drain coupled to node N0, and its gate coupled to node NIN to receive the input IN. P-channel transistor M6' has its source coupled to VCC, its drain coupled to node N0, and its gate coupled to node NIN to receive IN. A capacitor C2' is coupled between node N0 and VCC, and the output inverter 27' has its input coupled to node N0 and produces INDEL at its output. N-channel transistor M5' has its drain coupled to VCC, its source coupled to node N1, and its gate coupled to receive IN through the inverter 26'.

Operation of the delay cell core 22' is now briefly described. When the input signal IN goes low, the p-channel transistor M6' is turned on, forcing node N0 to VCC and therefore discharging the capacitor C2.

When the input signal goes high, the p-channel transistor M6' is turned off while the n-channel transistor M4' is turned on and the n-channel transistor M5' is turned off. Here, the reference current Iref mirrored by M23 will begin to discharge the node N0 (and thus the capacitor C2 will be discharges). The transient voltage waveform on node N0 will be a ramp from VCC to the threshold voltage at which inverter 27' will switch its output from low to high. Assuming the threshold voltage of the inverters 23 and 27' to be expressed as a fraction of the supply voltage VCC (accordingly to the on resistance of the nMOS and pMOS devices building the inverters themselves), assuming the voltage transient on the node N0 to be a perfect ramp (decreasing, in this case) against the previously described issues (e.g., continuity of the reference current Iref and charge injection), and neglecting second order error sources, the delay time is given by a product R*C, where R is PVT invariant.

Operation of the monostable circuit 40' is as follows. At the instant when IN goes high, INBDEL will still be high as IN has not had the time to propagate through the delay cell 20" and inverter 41'. Therefore, the AND gate 42' receives two logic highs as its input, and therefore its output OUT will go high. After a time equal to the delay time provided by the delay cell 20" and the delay time provided by the inverter 41', INBDEL will go low, and therefore the output OUT of the AND gate 42' will fall low. Since the delay time provided by the delay cell 20" is substantially greater than that provided by the inverter 41', the output OUT will therefore take the form of a monostable pulse having a pulse width substantially equal to the delay time provided by the delay cell 20". The adjustable resistance 25 is now described in detail with reference to FIG. 3. The adjustable reference 25 is comprised of a trimming voltage (Vtrim) generator 31 (which can also be referred to as a reference variable, but stable against PVT variation, resistance), and a PVT compensated variable resistance 32.

Figure 3:
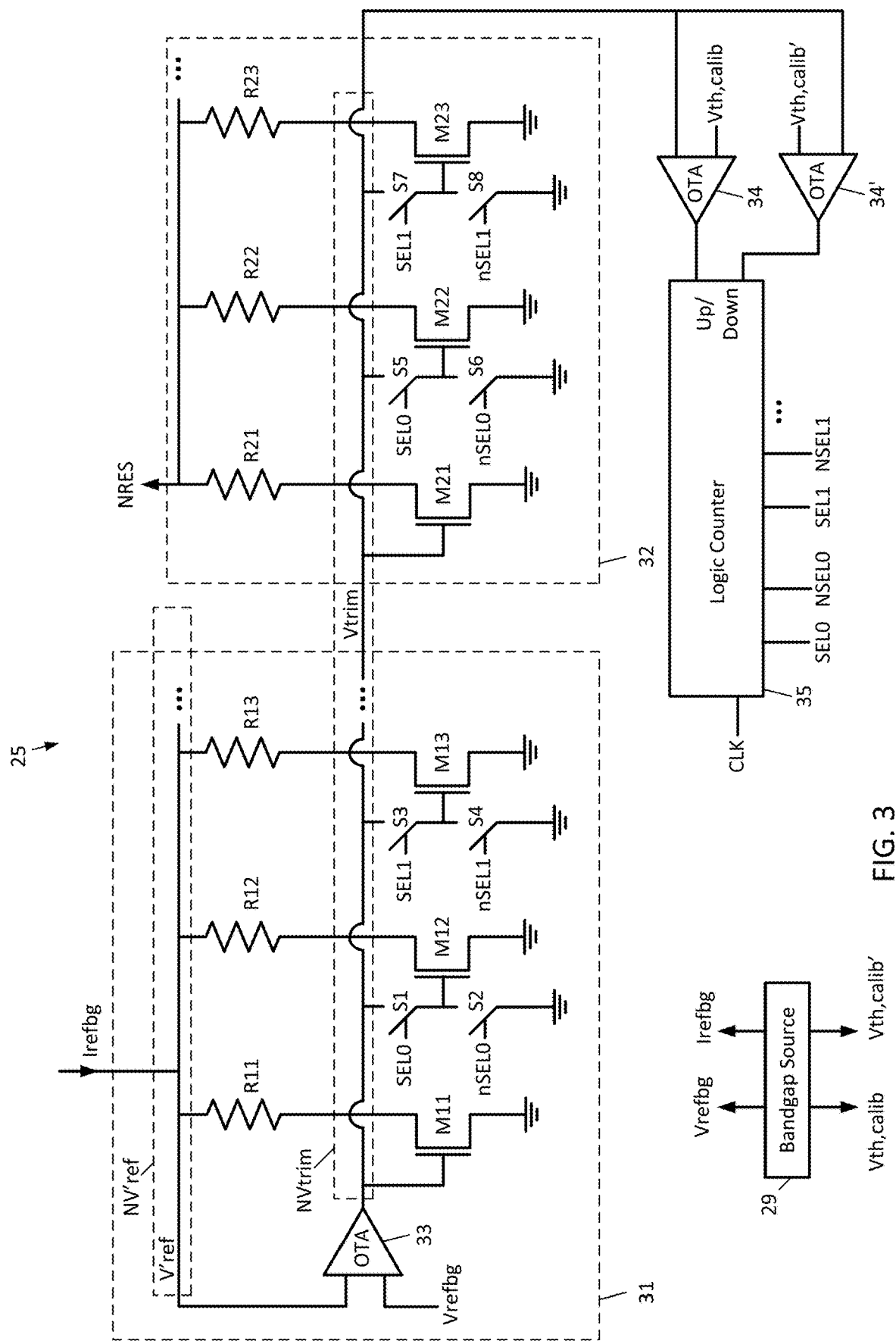
FIG. 3 is a schematic diagram of the adjustable resistance of the delay cell of FIG. 2.

As can be seen in FIG. 3, the Vtrim generator 31 receives a bandgap current Irefbg from a bandgap source 29. In particular, the reference current Irefbg is received at node NV'ref. A transconductance amplifier 33 has a first input coupled to node NV'ref, a second input coupled to a bangap reference voltage Vrefbg from a bandgap voltage generator, and an output coupled to node NVtrim. An n-channel transistor M11 has its drain coupled to node NV'ref through resistor R11, its source coupled to ground, and its gate coupled to node NVtrim. An n-channel transistor M12 has its drain coupled to node NV'ref through resistor R12, its source coupled to ground, and its gate selectively coupled to either node NVtrim or ground by switches S1 and S2, respectively, which operate based on opposite logic states of the select signal bit SEL0 and its complement nSEL0. An n-channel transistor M13 has its drain coupled to node NV'ref through resistor R13, its source coupled to ground, and its gate selectively coupled to either node NVtrim or ground by switches S3 and S4, respectively, which operate based on opposite logic states of the select signal bit SEL1 and its complement nSEL1.

Although the Vtrim generator 31 is shown as including three resistors R11, R12, and R13, three n-channel transistors M11, M12, and M13, and switches equal in number to two less than two multiplied by the total number of the n-channel transistors M11, M12, and M13, it should be understood that there may be any number of such resistors and a corresponding number of transistors and switches.

The PVT compensated variable resistance 32 includes an n-channel transistor M21 having its drain coupled to node NRES through resistor R21, its source coupled to ground, and its gate coupled to node NVtrim.

An n-channel transistor M22 has its drain coupled to node NRES through resistor R21, its source coupled to ground, and its gate selectively coupled to either node NVtrim or ground by switches S5 and S6, respectively, which operate based on opposite logic states of the select signal bit SEL0 and its complement nSEL0. An n-channel transistor M23 has its drain coupled to node NRES through resistor R23, its source coupled to ground, and its gate selectively coupled to either node NVtrim or ground by switches S7 and S8, respectively, which operate based on opposite logic states of the select signal bit SEL1 and its complement nSEL1.

Although the PVT compensated variable resistance 32 is shown as including three resistors R21, R22, and R23, three n-channel transistors M21, M22, and M23, and switches equal in number to two less than two multiplied by the total number of the n-channel transistors M21, M22, and M23, it should be understood that there may be any number of such resistors and a corresponding number of transistors and switches.

A first transconductance amplifier 34 has a first input coupled to node NVtrim, a second input receiving a first calibrated voltage Vth,calib, and an output. A second transconductance amplifier 34' has a first input coupled to a second calibrated voltage Vth,calib'. Vth,calib and Vth,calib' have different values, with Vth,calib being an upper threshold voltage aimed to preserve the bias of the transconductance amplifier 33 and with a Vth,calib' being a lower threshold aimed to define the limit for ohmic biasing of the n-channel transistors M11, M12, M13 and M21, M22, M23.

A logic counter circuit 35 receives the outputs from the transconductance amplifiers 34, 34', as well as a clock signal CLK, and generates select signal SEL (having bits SEL0, SEL1 . . . ) and its complement NSEL (having bits nSEL0, nSEL1 . . . ).

The transconductance amplifier 33 drives the gates of transistor M11 and the gates of which of transistors M12, M13 have their gates coupled to node NVTrim, with a voltage Vtrim generated so that the voltage of the node NV'ref is set to a value V'ref equal to Vrefbg thanks to the feedback loop. The voltage V'ref is applied to the branch containing the transistor M11 in series with the resistor R11 in parallel with the branch containing the transistor M12 in series with the resistor R12 (if the switch S1 is closed) and with the branch containing the transistor M13 in series with the resistor R13 (if the switch S3 is closed). Since the current that flows through the resistors is fixed to the bandgap current Irefbg, the series resistance of R11 and n-channel transistor M11 (in parallel with the series resistance of resistor R12 and n-channel transistor M12 if switch S1 is closed, and/or in parallel with the series resistance of resistor R13 and n-channel transistor M13 if switch S3 is closed), the resistance of this is forced to a resistance of Vrefbg/Irefbg, which is constant since Vrefbg and Irefbg are respectively a bandgap voltage and bandgap current (both of which are PVT invariant, as understood by those of skill in the art). Note that the voltage Vtrim keeps the transistors it drives in linear mode.

Stated differently, the transconductance amplifier 33 is in closed loop with the n-channel transistor M11 and the resistor R11 (in parallel with the n-channel transistor M12 and resistor R12 if switch S1 is closed, and n-channel transistor M13 and resistor R13 if switch S3 is closed). The loop forces node NV'ref to be equal to the voltage Vrefbg applied to the transconductance amplifier 33. At the same time, the loop itself is biased through the current Irefbg. Therefore, an equivalent resistance made by the series of n-channel transistor M11 (biased in ohmic region) and resistor R11 (in parallel with n-channel transistor M12 in series with resistor R12 if switch S1 is closed and n-channel transistor M13 in parallel of resistor R13 if switch S3 is closed) is defined by the ratio Vrefbg/Irefbg, and is PVT invariant since the bandgap source 29 is tailored to generate Vrefbg and Irefbg as PVT invariant.

As can be clearly seen from a review of the schematics of the Vtrim generator 31 and PVT compensated resistance 32, the PVT compensated resistance 32 is a replication of the Vtrim generator 31, with the exception being that the top terminal of resistors R21, R22, and R23 are coupled to node NRES instead of node NV'ref. Therefore, the voltage Vtrim sets the resistance of the combination of components in the PVT compensated resistance 32 to the same as that of the combination of components in the Vtrim generator 31.

Stated differently, the feedback loop in the Vtrim generator 31 allows definition of a resistance (the parallel resistance of the active (selected) branches made by the series connection of the n-channel transistor M11 and the resistor R12, and/or the series connection of the n-channel transistor M12 and the resistor R12, and/or the series connection of the p-channel transistor M13 and the resistor R13) equal to a PVT invariant value (Vrefbg/Irefbg). To accomplish this, the feedback loop acts on the voltage NVtrim—by modulating the voltage used to bias the gate of the n-channel transistors M11, M12, and M13 (in the ohmic region), and their on resistance is consequently modulated in order to satisfy the feedback condition. In detail, the on resistance of the n-channel transistors M11, M12, and M13 is updated by the feedback loop so that the whole branch resistance can satisfy the relationship imposed by the feedback loop (which is to be equal to Vrefbg/Irefbg). The adjustable resistance 32 is a perfect replica (other than matching imprecision) of the branches present in the Vtrim generator 31. The same voltage Vtrim that biases (in the feedback loop) the gates of the n-channel transistors M11, M12, and M13 is used to bias the gates of the n-channel transistors M21, M22, and M23. This means that the branches in the adjustable resistance 32 will have, in this matched replica topology, the same resistance as the Vtrim generator 31. The feedback loop in the Vtrim generator 31 defines the proper value for Vtrim to have an equivalent reference resistance that is PVT invariant (Vrefbg/Irefbg). Then, once this voltage is produced, it is used in the replica configuration of the adjustable resistance 32 to duplicate a similar resistance to be used in the bias current generator 21.

In the shown implementation, the calibrated voltages Vth,calib. Vth,calib' are also bandgap voltages delivered by a bandgap voltage generator. However, it should be understood that these calibrated voltages Vth,calib, Vth,calib' need not actually be PVT invariant, and will provide for proper functionality if the calibrated voltages Vth,calib, Vth,calib' are sufficiently constant over PVT variations to be usable by the logic counter circuit 35 in identifying whether the transistors M11, M12, M13, M21, M22, and M23 are properly being driven in linear mode, or if these transistors have improperly been switched into saturation. Since the bias voltage range to drive the transistors M11, M12, M13, M21, M22, and M23 is relatively wide, moderate variation in Vth,calib or Vth,calib' is generally acceptable.

Operation of the logic counter 35 is now described. The transconductance amplifier 34 compares Vtrim to Vth,calib and the transconductance amplifier 34' compares Vtrim to Vth,calib'. If Vtrim is greater than Vth,calib, then the transconductance amplifier 34 asserts its output to generate a "down" count; likewise, if Vtrim is less than Vth,calib', then the transconductance amplifier 34' asserts its output to generate an "up" count.

If the voltage at NVtrim is too high, there is a risk that the transconductance amplifier 33 malfunctions. If the n-channel transistor M11 has too high of a resistance (and the series resistance of the n-channel transistor and resistor R11 is greater than the desired value Vrefbg/Irefbg), the loop will work to reduce the resistance of the n-channel transistor M11 by increasing the voltage at NVtrim. If the voltage at NVtrim rises above a first threshold (defined by the accordingly designed transconductance amplifier 33 biasing constraints with adequate margins), the logic counter 35 decides, in order to reduce the resistivity of the equivalent resistance, to not increase further the voltage at NVtrim but to instead add an additional branch (i.e. the n-channel transistor M12 in series with the resistor R12). This can help ensure the equivalent resistance is kept equal to Vrefbg/Irefbg with a proper voltage at NVtrim for the gates of the transistors M11, M12, M13.

The case where the voltage at NVtrim is too low is now discussed. Assume that initially, two branches (the n-channel transistor M11 in series with the resistor R11, and the n-channel transistor M12 in series with the resistor R12) are activated in parallel. If the global resistance becomes smaller than the desired Vrefbg/Irefbg, the loop will work to increase the global resistance. This can be done by reducing the voltage at NVtrim. However, if the voltage at NVtrim falls too far, the n-channel transistors M11 and M12 risk exiting from the ohmic region. In that case, if the voltage at NVtrim falls below a second threshold voltage, instead of further decreasing the voltage at NVtrim, the logic counter 35 will decide to deassert the branch of n-channel transistor M12 in series with the resistor R12. This allows keeping the global resistance equal to Vrefbg/Irefbg with a more proper voltage at NVtrim for the gates of the transistors M11, M12, M13.

In some cases, the logic counter 35 may monitor the number of the "up" and "down" counts to set SEL0, SEL1 and nSEL0, nSEL1 properly during a calibration performed only at startup. In other cases, the logic counter 35 may perform this monitoring and setting periodically, or on demand. In still other cases, the logic counter 35 may continuously perform this monitoring and setting.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A monostable circuit, comprising:
    a delay cell, comprising:
        a reference inverter having its input directly electrically connected to its output and configured to generate a threshold voltage;
        a reference current generator configured to generate a reference current as a function of the threshold voltage and a process, voltage, and temperature (PVT) invariant resistance; and
        a delay block comprising:
            an output capacitor; and
            an output circuit configured, in response to an input signal, to alter an amount of charge stored on the output capacitor as a function of the reference current;
    a output inverter having an input coupled to the output circuit of the delay block and having an output; and
    a logic circuit configured to logically combine the output of the output inverter and the input signal to generate a monostable trigger pulse.

2. The monostable circuit of claim 1, wherein the output circuit of the delay block comprises:
    a current source configured to source the reference current to the output capacitor in response to a first logic state of the input signal; and
    a current sink configured to sink current from the output capacitor to discharge the output capacitor, in response to a second logic state of the input signal.

3. A monostable circuit, comprising:
    a delay cell, comprising:
        a reference inverter having its input coupled to its output and configured to generate a threshold voltage;
        a reference current generator configured to generate a reference current as a function of the threshold voltage and a process, voltage, and temperature (PVT) invariant resistance; and
        a delay block comprising:
            an output capacitor; and
            an output circuit configured, in response to an input signal, to alter an amount of charge stored on the output capacitor as a function of the reference current;
    a output inverter having an input coupled to the output circuit of the delay block and having an output; and
    a logic circuit configured to logically combine the output of the output inverter and the input signal to generate a monostable trigger pulse;
    wherein the output circuit of the delay block comprises:
        a first p-channel transistor having a source coupled to receive the reference current, a drain, and a gate coupled to receive the input signal;
        a second p-channel transistor having a source coupled to the source of the first p-channel transistor, a drain coupled to ground, and a gate coupled to receive a complement of the input signal; and
        an n-channel transistor having a drain coupled to the drain of the first p-channel transistor, a source coupled to ground, and a gate coupled to receive the input signal; and
    wherein the output capacitor is coupled between the drain of the n-channel transistor and ground.

4. The monostable circuit of claim 3, wherein the output circuit of the delay block further comprises an output inverter having an input coupled to the drain of the n-channel transistor and an output.

5. The monostable circuit of claim 3,
    wherein the reference current generator comprises:
        a reference voltage generator configured to generate a reference voltage;
        a first transconductance amplifier having a first input coupled to receive the reference voltage, a second input coupled to receive a feedback voltage, and an output;
        an n-channel transistor having a drain, a source coupled to the PVT invariant resistance, and a gate coupled to the output of the first transconductance amplifier, wherein the PVT invariant resistance is coupled between the source of the n-channel transistor and ground; and
        a p-channel transistor having a source coupled to a supply voltage, a drain coupled to the drain of the n-channel transistor of the reference current generator, and a gate coupled to the drain of the p-channel transistor of the reference current generator; and
    wherein the delay block comprises a third p-channel transistor having a source coupled to the supply voltage, a drain coupled to the source of the first p-channel transistor of the output circuit of the delay block, and a gate coupled to the gate of the p-channel transistor of the reference current generator.

6. The monostable circuit of claim 5, wherein the PVT invariant resistance comprises:
a reference resistance generator configured to generate a reference resistance based upon a bandgap current and a bandgap voltage; and
a replica resistance generator coupled to the reference resistance generator and configured to generate a resistance value for the PVT invariant resistance that is equal to a resistance value of the reference resistance.

7. The monostable circuit of claim 5, wherein the PVT invariant resistance comprises:
a bandgap current generator coupled to provide a bandgap current to a node;
a second transconductance amplifier having a first input coupled to the node, a second input coupled to receive a bandgap voltage, and an output;
a reference resistance generator comprising:
  a first reference n-channel transistor having a drain coupled to the node through a first reference resistor, a source coupled to ground, and a gate coupled to the output of the second transconductance amplifier of the PVT invariant resistance; and
  a second reference n-channel transistor having a drain coupled to the node through a second reference resistor, a source coupled to ground, and a gate selectively coupled to the output of the second transconductance amplifier of the PVT invariant resistance through a first switch controlled by a selection signal;
wherein the second transconductance amplifier of the PVT invariant resistance drives the gates of the first and second reference n-channel transistors such that a voltage produced at the node equals the bandgap voltage; and
a replica resistance generator comprising:
  a first replica n-channel transistor having a drain coupled to the source of the n-channel transistor of the reference current generator through a first replica resistor, a source coupled to ground, and a gate coupled to the output of the second transconductance amplifier of the PVT invariant resistance; and
  a second reference n-channel transistor having a drain coupled to the source of the n-channel transistor of the reference current generator through a second replica transistor, a source coupled to ground, and a gate selectively coupled to the output of the second transconductance amplifier of the PVT invariant resistance through a second switch controlled by an inverse of the selection signal.

8. The monostable circuit of claim 7, further comprising a feedback circuit configured to compare the output of the second transconductance amplifier of the PVT invariant resistance to a calibration voltage, to reduce an output voltage of the second transconductance amplifier if the output voltage of the second transconductance amplifier is sufficiently higher than the reference voltage by turning on the second reference n-channel transistor by adjusting the selection signal such that the first switch and second switch close, and to increase the output voltage if the output of the second transconductance amplifier is sufficiently lower than the reference voltage by turning off the second reference n-channel transistor by adjusting the selection signal such that the first switch and second switch open.

9. A monostable circuit, comprising:
a delay cell, comprising:
  a reference inverter having its input coupled to its output and configured to generate a threshold voltage;
  a reference current generator configured to generate a reference current as a function of the threshold voltage and a process, voltage, and temperature (PVT) invariant resistance; and
  a delay block comprising:
    an output capacitor; and
    an output circuit configured, in response to an input signal, to alter an amount of charge stored on the output capacitor as a function of the reference current;
a output inverter having an input coupled to the output circuit of the delay block and having an output; and
a logic circuit configured to logically combine the output of the output inverter and the input signal to generate a monostable trigger pulse;
wherein the threshold voltage generated by the reference inverter is substantially equal to a threshold voltage of the output inverter.

10. The monostable circuit of claim 9, wherein the output circuit of the delay block comprises:
a current source configured to source the reference current to the output capacitor in response to a first logic state of the input signal; and
a current sink configured to sink current from the output capacitor to discharge the output capacitor, in response to a second logic state of the input signal.

11. A monostable circuit, comprising:
a delay cell, comprising:
  a reference inverter having its input coupled to its output and configured to generate a threshold voltage;
  a reference current generator configured to generate a reference current as a function of the threshold voltage and a process, voltage, and temperature (PVT) invariant resistance; and
  a delay block comprising:
    an output capacitor; and
    an output circuit configured, in response to an input signal, to alter an amount of charge stored on the output capacitor as a function of the reference current;
a output inverter having an input coupled to the output circuit of the delay block and having an output; and
a logic circuit configured to logically combine the output of the output inverter and the input signal to generate a monostable trigger pulse;
wherein the output circuit of the delay block comprises:
  a first n-channel transistor having a source coupled to receive the reference current, a drain, and a gate coupled to receive the input signal;
  a second n-channel transistor having a source coupled to the source of the first n-channel transistor, a drain coupled to a supply voltage, and a gate coupled to receive a complement of the input signal; and
  a p-channel transistor having a drain coupled to the drain of the first n-channel transistor, a source coupled to the supply voltage, and a gate coupled to receive the input signal; and
wherein the output capacitor is coupled between the drain of the p-channel transistor and the supply voltage.

12. The monostable circuit of claim 11, wherein the output circuit of the delay block further comprises an output inverter having an input coupled to the drain of the first n-channel transistor of the output circuit of the delay block.

13. The monostable circuit of claim 11,
wherein the reference current generator comprises:
a reference voltage generator configured to generate a reference voltage;
a first transconductance amplifier having a first input coupled to receive the reference voltage, a second input coupled to receive a feedback voltage, and an output;
an n-channel transistor having a drain, a source coupled to the PVT invariant resistance, and a gate coupled to the output of the first transconductance amplifier, wherein the PVT invariant resistance is coupled between the source of the n-channel transistor of the reference current generator and ground;
a first p-channel transistor having a source coupled to the supply voltage, a drain coupled to the drain of the n-channel transistor of the reference current generator, and a gate coupled to the drain of the first p-channel transistor of the reference current generator; and
a second p-channel transistor having a source coupled to the supply voltage, a drain, and a gate coupled to the gate of the first p-channel transistor of the reference current generator; and
wherein the delay block comprises:
a third n-channel transistor having a source coupled to ground, a drain coupled to the drain of the second p-channel transistor of the reference current generator, and a gate coupled to the drain of the third n-channel transistor; and
a fourth n-channel transistor having a source coupled to ground, a drain coupled to the source of the first n-channel transistor of the output circuit of the delay block, and a gate coupled to the gate of the third n-channel transistor.

14. The monostable circuit of claim 13, wherein the PVT invariant resistance comprises:
a reference resistance generator configured to generate a reference resistance based upon a bandgap current and a bandgap voltage; and
a replica resistance generator coupled to the reference resistance generator and configured to generate a resistance value for the PVT invariant resistance that is equal to a resistance value of the reference resistance.

15. The monostable circuit of claim 13, wherein the PVT invariant resistance comprises:
a bandgap current generator coupled to provide a bandgap current to a node;
a second transconductance amplifier having a first input coupled to the node, a second input coupled to receive a bandgap voltage, and an output;
a reference resistance generator comprising:
a first reference n-channel transistor having a drain coupled to the node through a first reference resistor, a source coupled to ground, and a gate coupled to the output of the second transconductance amplifier of the PVT invariant resistance; and
a second reference n-channel transistor having a drain coupled to the node through a second reference resistor, a source coupled to ground, and a gate selectively coupled to the output of the second transconductance amplifier of the PVT invariant resistance through a first switch controlled by a selection signal;
wherein the second transconductance amplifier of the PVT invariant resistance drives the gates of the first and second reference n-channel transistors such that a voltage produced at the node equals the bandgap voltage; and
a replica resistance generator comprising:
a first replica n-channel transistor having a drain coupled to the source of the n-channel transistor of the reference current generator through a first replica resistor, a source coupled to ground, and a gate coupled to the output of the second transconductance amplifier of the PVT invariant resistance; and
a second reference n-channel transistor having a drain coupled to the source of the n-channel transistor of the reference current generator through a second replica transistor, a source coupled to ground, and a gate selectively coupled to the output of the second transconductance amplifier of the PVT invariant resistance through a second switch controlled by an inverse of the selection signal.

16. The monostable circuit of claim 15, further comprising a feedback circuit configured to compare the output of the second transconductance amplifier of the PVT invariant resistance to a calibration voltage, to reduce an output voltage of the second transconductance amplifier if the output voltage of the second transconductance amplifier is sufficiently higher than the reference voltage by turning on the second reference n-channel transistor by adjusting the selection signal such that the first switch and second switch close, and to increase the output voltage if the output of the second transconductance amplifier is sufficiently lower than the reference voltage by turning off the second reference n-channel transistor by adjusting the selection signal such that the first switch and second switch open.

17. A delay cell, comprising:
a reference current generator configured to generate a reference current as a function of a threshold voltage and a process, voltage, and temperature (PVT) invariant resistance; and
a delay block comprising:
an output capacitor; and
an output circuit configured, in response to an input signal, to alter an amount of charge stored on the output capacitor as a function of the reference current;
wherein the PVT invariant resistance comprises:
a reference resistance generator configured to generate a reference resistance based upon a bandgap current and a bandgap voltage; and
a replica resistance generator coupled to the reference resistance generator and configured to generate a resistance value for the PVT invariant resistance that is equal to a resistance value of the reference resistance.

18. The delay cell of claim 17, wherein the reference current generator comprises:
a reference voltage generator configured to generate a reference voltage;
a first transconductance amplifier having a first input coupled to receive the reference voltage, a second input coupled to receive a feedback voltage, and an output;
an n-channel transistor having a drain, a source coupled to the PVT invariant resistance, and a gate coupled to the output of the first transconductance amplifier, wherein the PVT invariant resistance is coupled between the source of the n-channel transistor of the reference current generator and ground; and a p-channel transistor having a source coupled to a supply voltage, a drain coupled to the drain of the n-channel transistor of the reference current generator, and a gate coupled to the drain of the p-channel transistor of the reference current generator.

19. The delay cell of claim 18,
wherein the PVT invariant resistance further comprises:
   a bandgap current generator coupled to provide a bandgap current to a node;
   a second transconductance amplifier having a first input coupled to the node, a second input coupled to receive a bandgap voltage, and an output;
wherein the reference resistance generator comprises:
   a first reference n-channel transistor having a drain coupled to the node through a first reference resistor, a source coupled to ground, and a gate coupled to the output of the second transconductance amplifier of the PVT invariant resistance; and
   a second reference n-channel transistor having a drain coupled to the node through a second reference resistor, a source coupled to ground, and a gate selectively coupled to the output of the second transconductance amplifier of the PVT invariant resistance through a first switch controlled by a selection signal;
   wherein the second transconductance amplifier drives the gates of the first and second reference n-channel transistors such that a voltage produced at the node equals the bandgap voltage; and
wherein the replica resistance generator comprises:
   a first replica n-channel transistor having a drain coupled to the source of the n-channel transistor of the reference current generator through a first replica resistor, a source coupled to ground, and a gate coupled to the output of the second transconductance amplifier of the PVT invariant resistance; and
   a second reference n-channel transistor having a drain coupled to the source of the n-channel transistor of the reference current generator through a second replica transistor, a source coupled to ground, and a gate selectively coupled to the output of the second transconductance amplifier of the PVT invariant resistance through a second switch controlled by an inverse of the selection signal.

20. The delay cell of claim 19, further comprising a feedback circuit configured to compare the output of the second transconductance amplifier of the PVT invariant resistance to a calibration voltage, to reduce an output voltage of the second transconductance amplifier if the output voltage of the second transconductance amplifier is sufficiently higher than the reference voltage by turning on the second reference n-channel transistor by adjusting the selection signal such that the first switch and second switch close, and to increase the output voltage if the output of the second transconductance amplifier is sufficiently lower than a reference voltage by turning off the second reference n-channel transistor by adjusting the selection signal such that the first switch and second switch open.

\* \* \* \* \*